US010636616B2

(12) United States Patent
Iizuka

(10) Patent No.: US 10,636,616 B2
(45) Date of Patent: Apr. 28, 2020

(54) APERTURE ARRAY ALIGNMENT METHOD AND MULTI CHARGED PARTICLE BEAM WRITING APPARATUS

(71) Applicant: NuFlare Technology, Inc., Yokohama-shi (JP)

(72) Inventor: Osamu Iizuka, Yokohama (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days.

(21) Appl. No.: 16/236,668

(22) Filed: Dec. 31, 2018

(65) Prior Publication Data
US 2019/0214218 A1  Jul. 11, 2019

(30) Foreign Application Priority Data

Jan. 10, 2018  (JP) .................................. 2018-001782

(51) Int. Cl.
*H01J 37/04* (2006.01)
*H01J 37/317* (2006.01)
*H01J 37/20* (2006.01)

(52) U.S. Cl.
CPC ............ *H01J 37/045* (2013.01); *H01J 37/20* (2013.01); *H01J 37/3177* (2013.01); *H01J 2237/024* (2013.01); *H01J 2237/0435* (2013.01)

(58) Field of Classification Search
USPC .................................................. 250/492.22
See application file for complete search history.

(56) References Cited

U.S. PATENT DOCUMENTS

| 2006/0169898 A1* | 8/2006 | Muraki | B82Y 10/00 250/310 |
| 2014/0158903 A1* | 6/2014 | Sano | H01J 37/302 250/397 |
| 2017/0146910 A1* | 5/2017 | Nanao | G03F 7/2059 |
| 2018/0350552 A1* | 12/2018 | Morita | H01J 37/045 |

FOREIGN PATENT DOCUMENTS

| JP | 6-124883 | 5/1994 |
| JP | 7-161605 | 6/1995 |
| JP | 2017-98429 | 6/2017 |
| TW | 201716880 A | 5/2017 |
| TW | 201727703 A | 8/2017 |

OTHER PUBLICATIONS

Taiwanese Office Action dated Jan. 17, 2020 in Taiwanese Application No. 107144457, with English Translation, 8 pages.

* cited by examiner

*Primary Examiner* — Kiet T Nguyen
(74) *Attorney, Agent, or Firm* — Oblon, McClelland, Maier & Neustadt, L.L.P.

(57) ABSTRACT

An aperture array alignment method according to the present embodiment includes switching on and off of each of multiple beams using a blanking aperture array plate, and detecting beam current on a stage using a detector. At least one of the multiple beams is turned on to scan the blanking aperture array plate, and a current map is generated on the basis of a result of detection of the beam current made by the detector and a position of the blanking aperture array plate. An on-beam is switched from one to another to generate the current map for each of the on-beams. The position of the blanking aperture array plate is adjusted on the basis of the current maps for the on-beams.

13 Claims, 15 Drawing Sheets

APERTURE ARRAY ALIGNMENT METHOD AND MULTI CHARGED PARTICLE BEAM WRITING APPARATUS

CROSS REFERENCE TO RELATED APPLICATION

This application is based upon and claims benefit of priority from the Japanese Patent Application No. 2018-1782, filed on Jan. 10, 2018, the entire contents of which are incorporated herein by reference.

FIELD

The present invention relates to an aperture array alignment method and a multi charged particle beam writing apparatus.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

A writing apparatus using multiple beams can provide significantly improved throughput, because it is capable of irradiating with more beams at a time than when writing with a single electron beam. In a multi-beam writing apparatus using a blanking aperture array (which is an exemplary multi-beam writing apparatus), for example, an electron beam emitted from an electron gun is passed through a shaping aperture array having a plurality of openings to form multiple beams (a plurality of electron beams). The multiple beams then pass through corresponding blankers in the blanking aperture array.

The blanking aperture array has electrode pairs configured to deflect individual beams, and each of the electrode pairs has an opening for beam passage between its electrodes. While one electrode of each electrode pair (blanker) is fixed at the ground potential, the other electrode is switched between the ground potential and another potential, and thus electron beams passing through are individually subjected to blanking deflection. Electron beams deflected by the blankers are blocked, whereas undeflected electron beams are applied onto a sample.

In conventional multi-beam writing apparatuses, if, for example, an aperture member is displaced in the height direction, tilted, or warped when mounted onto the apparatus, some of multiple beams formed by a shaping aperture array may fail to pass through openings in a blanking aperture array. As a result, a beam array to be formed into an image on the sample surface may be partially lost.

DETAILED DESCRIPTION

In one embodiment, an aperture array alignment method includes emitting a charged particle beam, forming multiple beams by allowing the charged particle beam to pass through a plurality of openings in a shaping aperture array plate, performing blanking deflection using a plurality of blankers in a blanking aperture array plate, the blanking deflection being performed by each of the blankers to switch on and off of a corresponding one of the multiple beams, and detecting beam current on a stage using a detector disposed on the stage, the stage being capable of holding a substrate thereon. At least one of the multiple beams is turned on to scan the blanking aperture array plate, and a current map is generated based on a result of detection of the beam current made by the detector and a position of the blanking aperture array plate. An on-beam is switched from one to another to generate the current map for each of the on-beams. The position of the blanking aperture array plate is adjusted based on the current maps for the on-beams.

Hereinafter, an embodiment of the present invention will be described based on the drawings. In the embodiment, as an example of a charged particle beam, a configuration using an electron beam will be described. However, the charged particle beam is not be limited to an electron beam, and may be an ion beam or the like.

Figure 1:
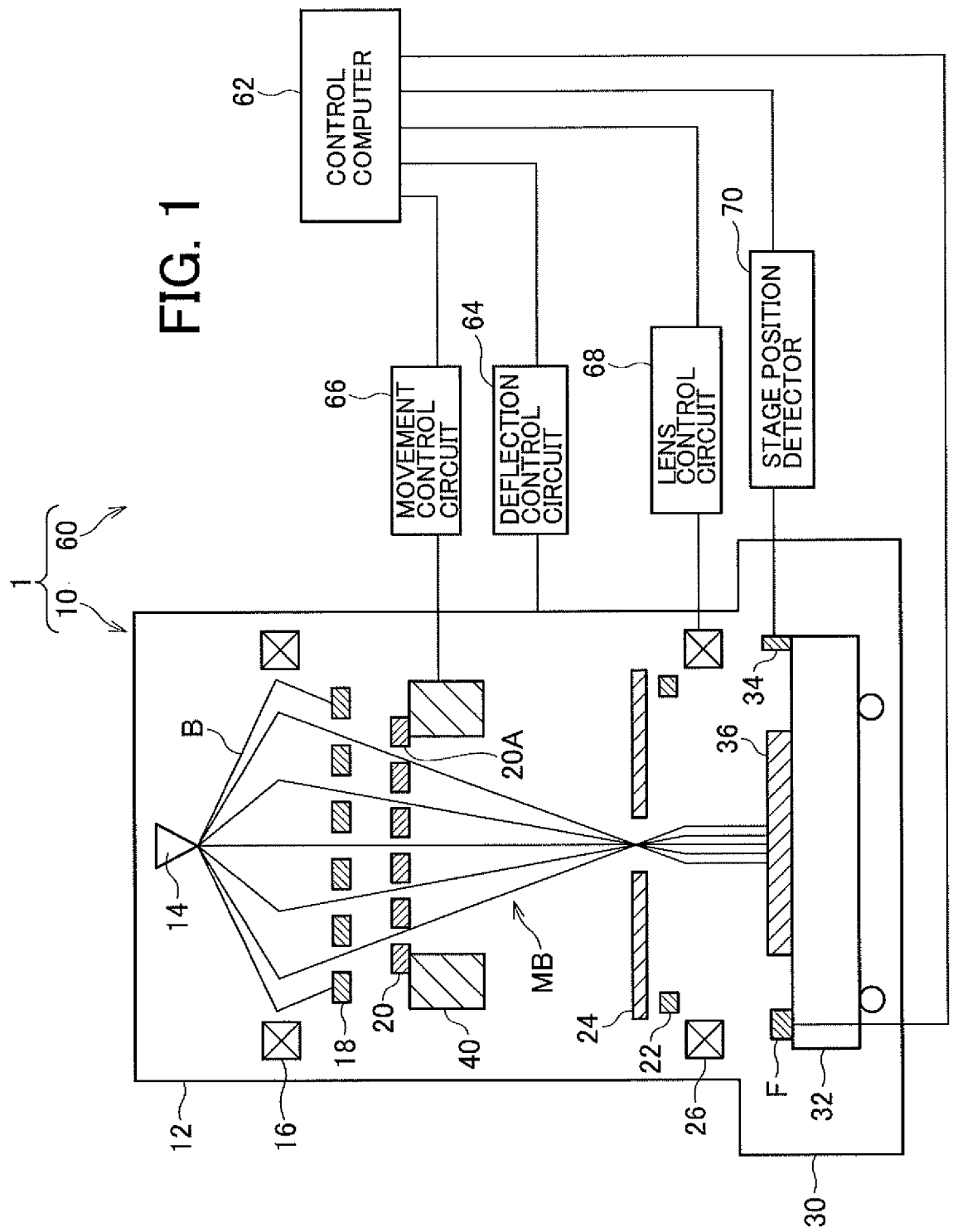
FIG. 1 is a general view of a multi charged particle beam writing apparatus according to an embodiment of the present invention.

A writing apparatus 1 illustrated in FIG. 1 includes a writer 10 configured to irradiate a target object, such as a mask or wafer, with electron beams to write a desired pattern thereon, and a controller 60 configured to control the writing operation of the writer 10. The writer 10 is a multi-beam writing device that includes an electron beam column 12 and a writing chamber 30.

The electron beam column 12 includes therein an electron gun 14, an illuminating lens 16, a shaping aperture array plate 18, a blanking aperture array plate 20, a deflector 22, a limiting aperture member 24, and an objective lens 26. An XY stage 32 is disposed in the writing chamber 30. The XY stage 32 is provided with a mirror 34 for measuring the position of the XY stage 32, a mask blank, which is a substrate 36 (writing target), and a detector F configured to detect the beam current of beams applied to the XY stage 32. For example, a Faraday cup may be used as the detector F.

The blanking aperture array plate 20 is attached to a moving unit 40 (an aperture array mover). For example, a motion base that generates a six-degree-of-freedom motion (forward/backward, up/down, right/left, roll, pitch, and yaw) may be used as the moving unit 40. With the moving unit 40, it is possible to adjust the position and tilt of the blanking aperture array plate 20 in the X direction, Y direction, and Z direction.

Figure 2:
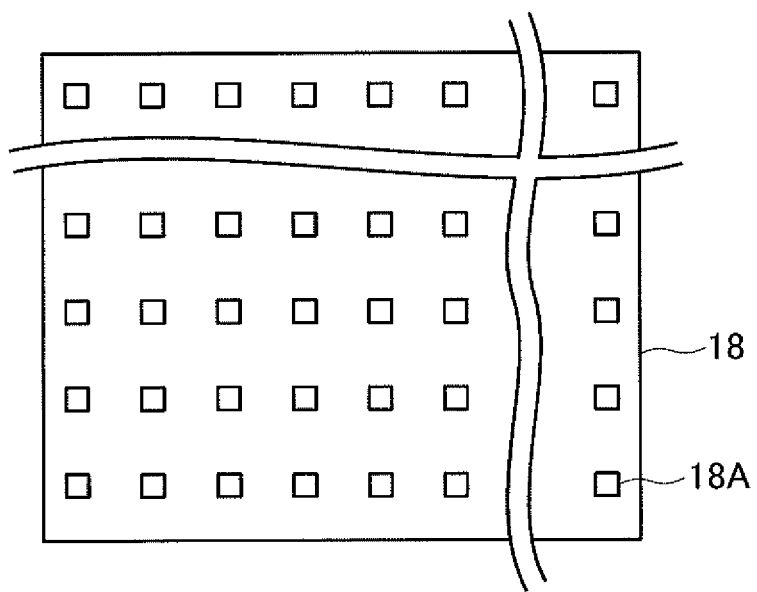
FIG. 2 is a schematic diagram of a shaping aperture array plate.

As illustrated in FIG. 2, the shaping aperture array plate 18 includes an m-column by n-row array of openings (first openings) 18A formed with a predetermined array pitch, where m and n are both greater than or equal to 2 (m, n≥2). All the openings 18A are rectangular openings of the same shape and dimensions. The openings 18A may be circular in shape. An electron beam B is formed into multiple beams MB by partially passing through the plurality of openings 18A.

The blanking aperture array plate 20 is disposed below the shaping aperture array plate 18. The blanking aperture array plate 20 has openings (second openings) 20A corresponding to the respective openings 18A in the shaping aperture array plate 18. The array pitch of the openings 20A is narrower than the array pitch of the openings 18A. The openings 20A are each provided with a blanker (not shown) composed of a pair of electrodes. One electrode of the blanker is fixed at the ground potential, whereas the other electrode is switched between the ground potential and another potential. An electron beam passing through each of the openings 20A is independently deflected by a voltage applied to the corresponding blanker. Thus, a plurality of blankers each perform blanking deflection of a corresponding one of the multiple beams MB travelling from the plurality of openings 18A in the shaping aperture array plate 18.

The controller 60 includes a control computer 62, a deflection control circuit 64, a movement control circuit 66, a lens control circuit 68, and a stage position detector 70. The deflection control circuit 64 is connected to the blanking aperture array plate 20 and the deflector 22. The movement control circuit 66 is connected to the moving unit 40.

In the writer 10, the illuminating lens 16 and the objective lens 26 form an electronic optical system. The electron beam B emitted from the electron gun 14 (emitting unit) is converged by the illuminating lens 16 and illuminates the entire shaping aperture array plate 18 in such a manner as to form a crossover in a center hole formed in the center of the limiting aperture member 24.

The electron beam B is formed into the multiple beams MB by passing through the plurality of openings 18A in the shaping aperture array plate 18. The multiple beams MB pass through corresponding ones of the blankers in the blanking aperture array plate 20. Each beam of the multiple beams MB travels at an angle toward the center hole of the limiting aperture member 24. This means that the overall diameter of the multiple beams MB and the beam pitch of the multiple beams MB both gradually decrease with increasing distance from the shaping aperture array plate 18.

The multiple beams MB pass through the blanking aperture array plate 20 with a pitch narrower than the beam pitch defined by the shaping aperture array plate 18. After passing through the blanking aperture array plate 20, the multiple beams MB travel toward the center hole of the limiting aperture member 24. Electron beams deflected by the blankers in the blanking aperture array plate 20 deviate from the center hole of the limiting aperture member 24 and are blocked by the limiting aperture member 24. On the other hand, electron beams not deflected by the blankers in the blanking aperture array plate 20 pass through the center hole of the limiting aperture member 24.

As described above, the limiting aperture member 24 blocks the beams that have been deflected by the blankers in the blanking aperture array plate 20 in such a manner as to be turned off. Beams passing through the limiting aperture member 24 after being turned on before being turned off are defined as beams of a single shot.

The multiple beams MB passed through the limiting aperture member 24 are brought into focus by the objective lens 26 to form a pattern image reduced to a desired reduction ratio. Beams (all multiple beams) passed through the limiting aperture member 24 are deflected together in the same direction by the deflector 22 and projected onto the substrate 36 at their respective irradiation positions.

The deflector 22 is disposed downstream of the limiting aperture member 24 in the optical path in the example illustrated in FIG. 1, but the deflector 22 may be disposed upstream of the limiting aperture member 24.

During continuous movement of the XY stage 32, the beam irradiation positions are controlled by the deflector 22 in such a manner as to follow the movement of the XY stage 32. Laser light is emitted from the stage position detector 70 toward the mirror 34, and the reflected light is used to measure the position of the XY stage 32. The XY stage 32 is moved by a stage controller (not shown).

The control computer 62 reads out writing data from a storage device (not shown), and performs multiple stages of data conversion to generate shot data that is specific to the apparatus. The shot data defines, for example, the amount of irradiation by each shot and the coordinates of the irradiation position of the shot.

On the basis of the shot data, the control computer 62 outputs the amount of irradiation by each shot to the deflection control circuit 64. The deflection control circuit 64 determines irradiation time t by dividing the input amount of irradiation by a current density. Then, for the corresponding shot, the deflection control circuit 64 applies a deflection voltage to the corresponding blanker in the blanking aperture array plate 20 in such a manner that the beam is "on" during the irradiation time t.

Also, the control computer 62 outputs deflection position data to the deflection control circuit 64 so that each beam is deflected to a position (coordinates) indicated by the shot data. The deflection control circuit 64 computes the amount of deflection and applies a deflection voltage to the deflector 22. Thus, the corresponding ones of the multiple beams MB to be shot are deflected together.

The control computer 62 acquires a result of current detection from the detector F.

If some of the multiple beams MB formed by the shaping aperture array plate 18 fail to pass through the openings 20A due to, for example, mounting error of the blanking aperture array plate 20, a beam array to be formed into an image on the substrate 36 is partially lost. In the present embodiment, the moving unit 40 adjusts the position or orientation of the blanking aperture array plate 20 for alignment (positioning), so as to allow the multiple beams MB to pass through the openings 20A.

For alignment of the blanking aperture array plate 20, first, only some of the multiple beams MB are turned on while the remaining beams are off. Then, each time the blanking aperture array plate 20 is moved in the XY direction by the moving unit 40, the detector F detects beam current.

Figure 3:
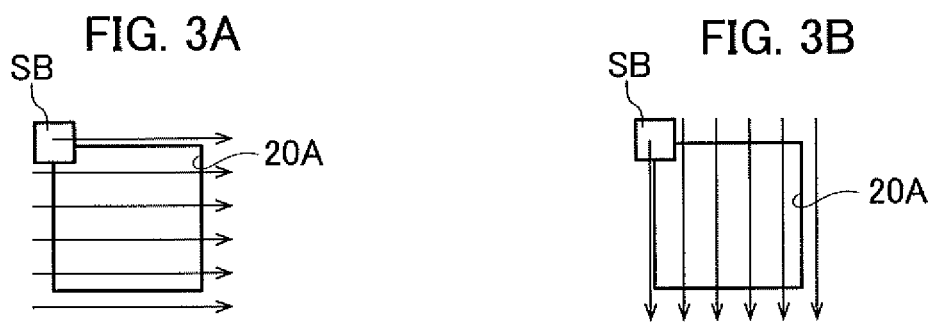
FIGS. 3A and 3B each illustrate an example of beam scanning over a blanking aperture array plate.
Figure 4:
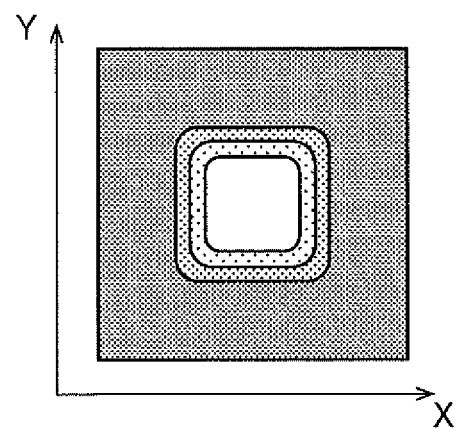
FIG. 4 illustrates a result of current detection.

Moving the blanking aperture array plate 20 allows a beam SB to relatively move and scan a corresponding one of the openings 20A in the XY direction. FIGS. 3A and 3B are schematic diagrams that focus on one beam SB and illustrate how the beam SB moves to scan the opening 20A in the XY direction. The movement of the blanking aperture array plate 20 and the current detection by the detector F are carried out alternately. This generates, as illustrated in FIG. 4, a contour map (current map) of the amount of current with respect to the X and Y coordinates of the blanking aperture array plate 20. The amount of current is greater in the center of the current map and decreases toward the periphery.

Figure 5A:
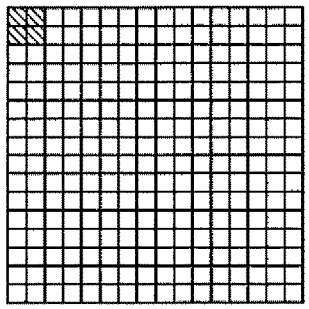
FIGS. 5A to 5I each illustrate an on-beam region.
Figure 5B:
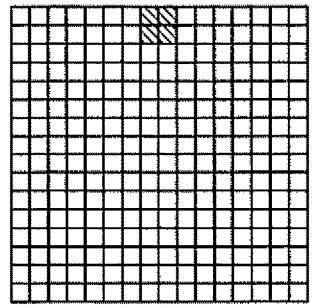
Figure 5C:
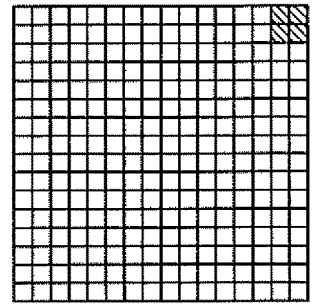
Figure 5D:
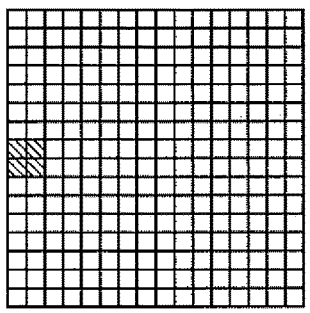
Figure 5E:
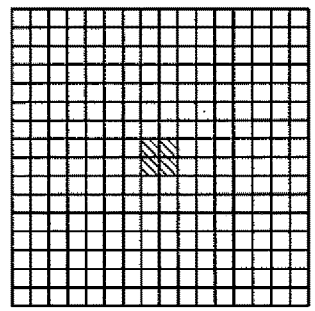
Figure 5F:
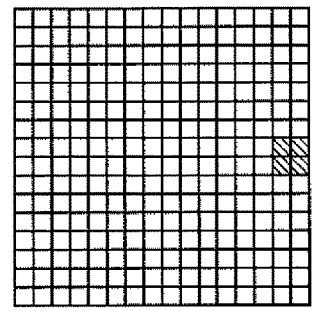
Figure 5G:
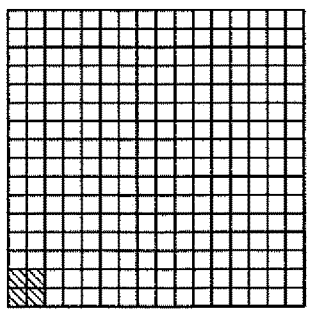
Figure 5H:
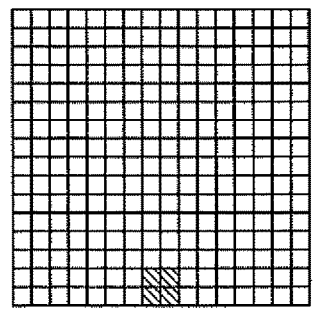
Figure 5I:
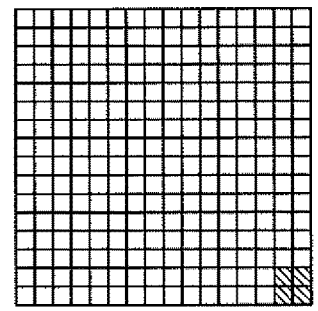

Such current maps are generated while on-beams are being switched. For example, as illustrated in FIGS. 5A to 5I, an on-beam region (marked with diagonal lines in the drawings) is switched from one to another. In this example, the multiple beams MB are composed of 16 by 16 beams, and nine on-beam regions are each composed of four beams. FIGS. 5A, 5C, 5G, and 5I show on-beam regions at four corners of a square array of multiple beams. FIGS. 5B, 5D, 5F, and 5H each show an on-beam region in the center of one of edges (in the side direction) along four sides of the square array of multiple beams. FIG. 5E shows an on-beam region in the center of the square array of multiple beams.

The number of beams included in each on-beam region is four, but the number is not limited to this. That is, each on-beam region may include any number of beams as long as the detector F can detect beam current. Also, the number of on-beam regions is not limited to nine, and may be either less or more than nine. By selecting the nine regions shown in FIGS. 5A to 5I as on-beam regions, a process (described below) which involves detecting positional displacement of the blanking aperture array plate 20 can be facilitated.

Figure 6:
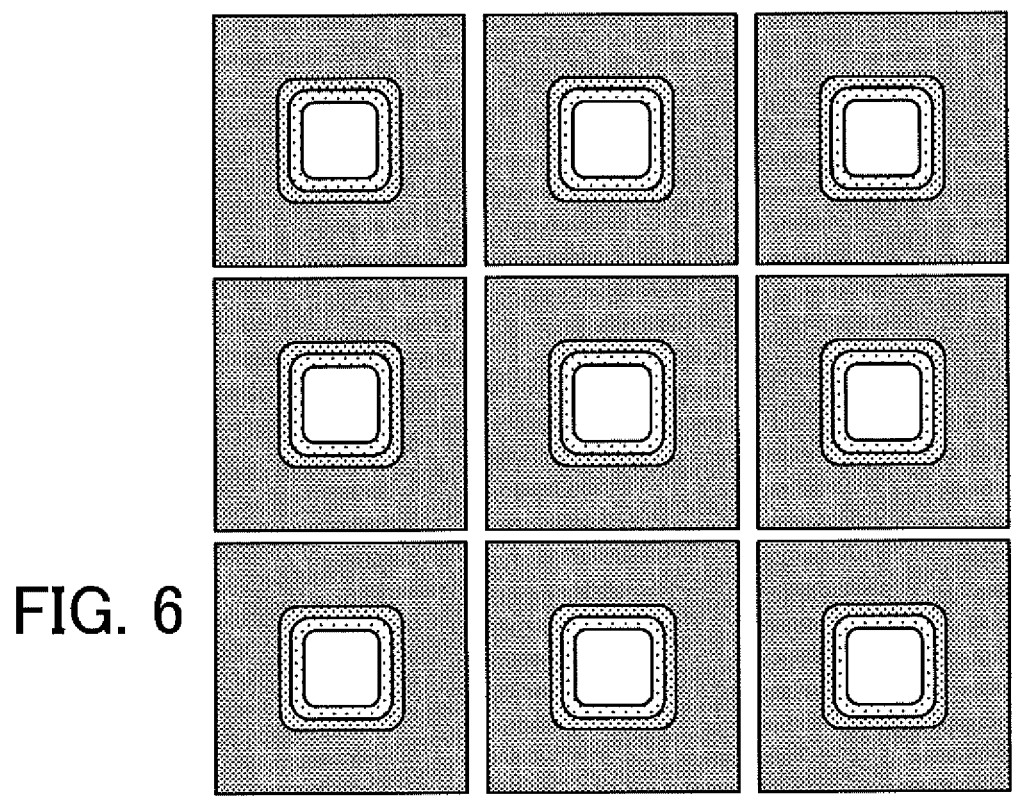
FIG. 6 illustrates a result of current detection obtained when the blanking aperture array plate is ideally aligned.

FIG. 6 illustrates current maps generated when on-beam regions are selected as in FIGS. 5A to 5I. As illustrated in FIG. 6, the current maps are arranged in accordance with the position of each on-beam region. For example, the current map at the upper left corner of FIG. 6 is a current map generated when the on-beam region is at the position shown in FIG. 5A. When the blanking aperture array plate 20 is ideally aligned, the highest contour line (intensity gravity center) in any current map is located in the center, as illustrated in FIG. 6, with respect to the X and Y coordinates.

Figure 7A:
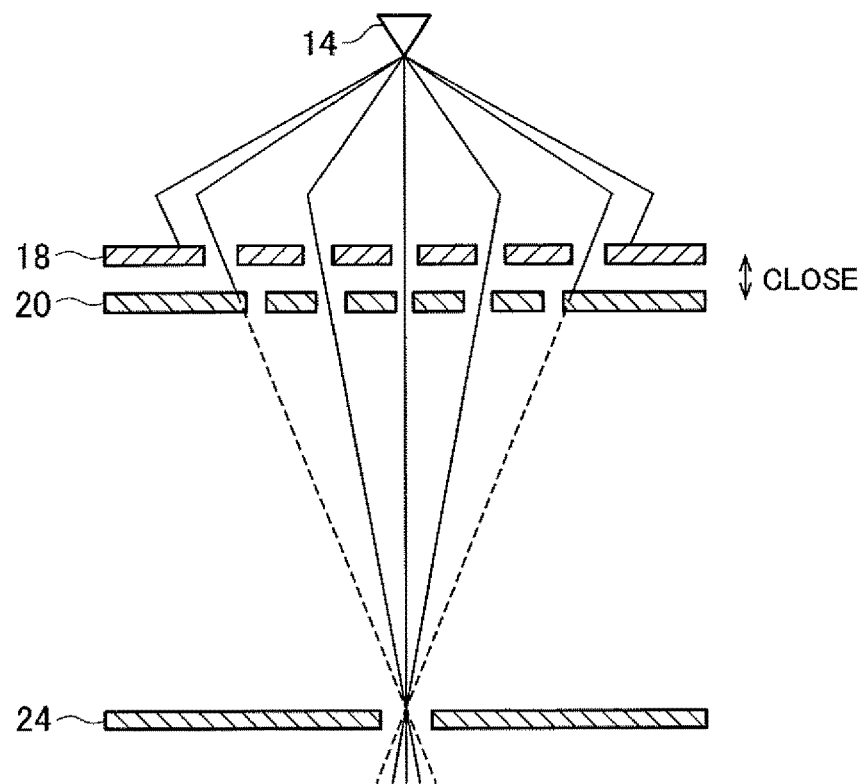
FIG. 7A is a schematic diagram of the writing apparatus in which the blanking aperture array plate is displaced in one height direction.
Figure 7B:
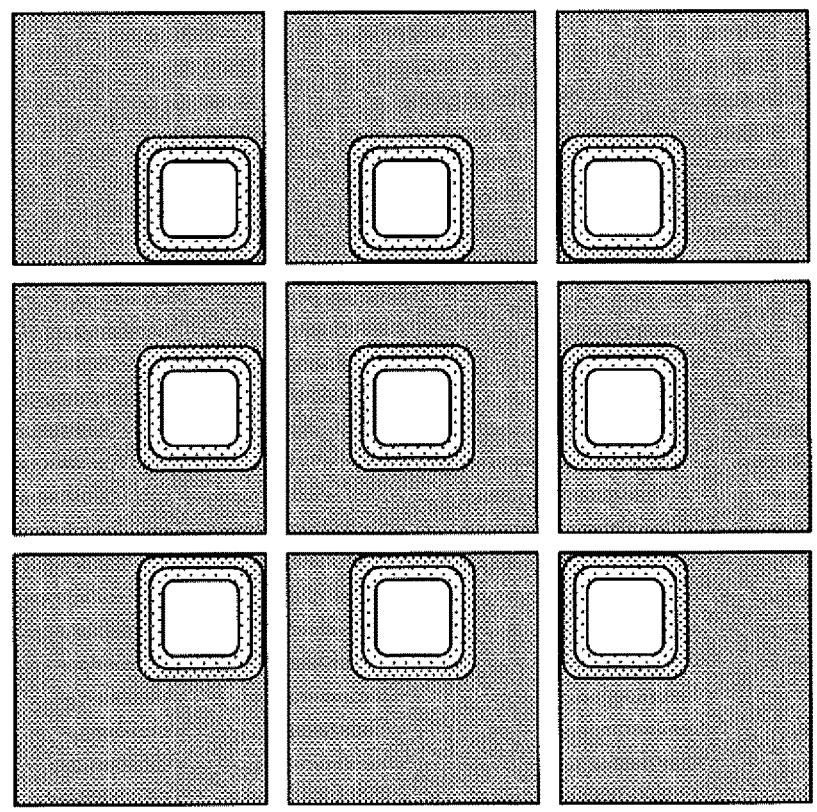
FIG. 7B illustrates the corresponding result of current detection.

FIG. 7A illustrates the blanking aperture array plate 20 which is closer to the shaping aperture array plate 18 than the ideal position is. In this case, as illustrated in FIG. 7B, the highest contour lines in the current maps that correspond to the on-beams along the periphery of the array of the multiple beams MB are brought closer to the current map in the center.

Figure 8A:
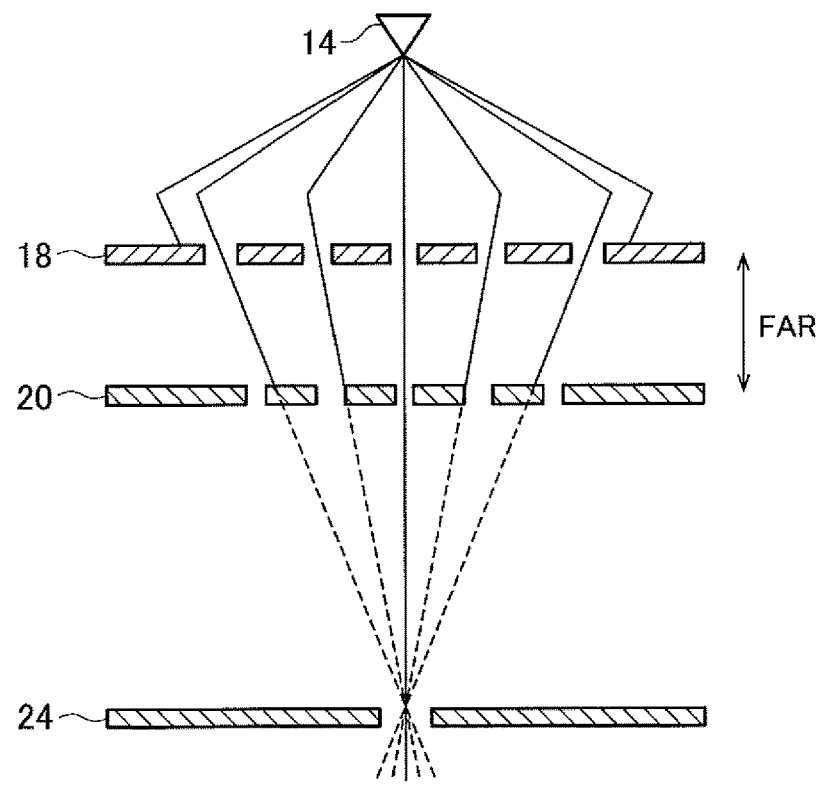
FIG. 8A is a schematic diagram of the writing apparatus in which the blanking aperture array plate is displaced in the other height direction.
Figure 8B:
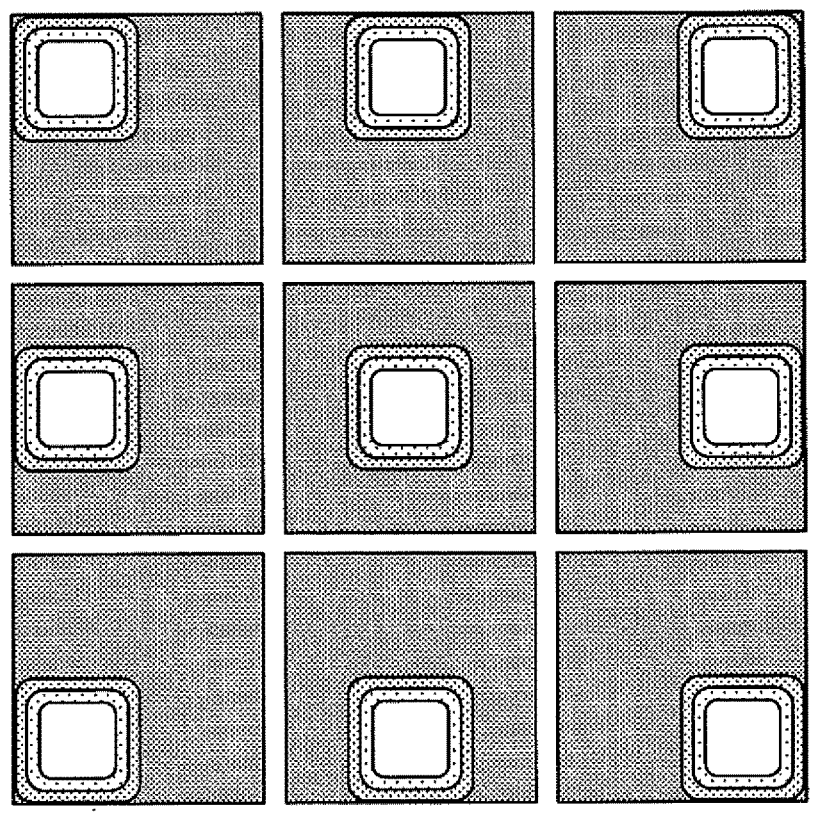
FIG. 8B illustrates the corresponding result of current detection.

FIG. 8A illustrates the blanking aperture array plate 20 which is farther from the shaping aperture array plate 18 than the ideal position is. In this case, as illustrated in FIG. 8B, the highest contour lines in the current maps that correspond to the on-beams along the periphery of the array of the multiple beams MB are brought farther from the current map in the center.

In the present embodiment, the blanking aperture array plate 20 is moved by the moving unit 40 in such a manner that the highest contour line in every current map is located in the center of the map. For example, the blanking aperture array plate 20 is lowered if current maps such as those illustrated in FIG. 7B are obtained, whereas the blanking aperture array plate 20 is raised if current maps such as those illustrated in FIG. 8B are obtained.

Figure 9A:
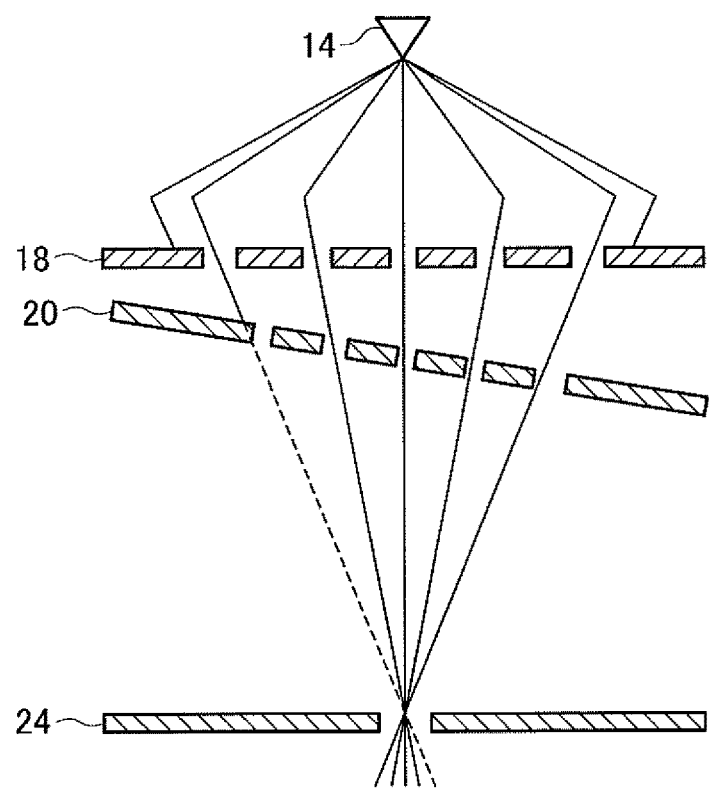
FIG. 9A is a schematic diagram of the blanking aperture array plate mounted at an angle.
Figure 9B:
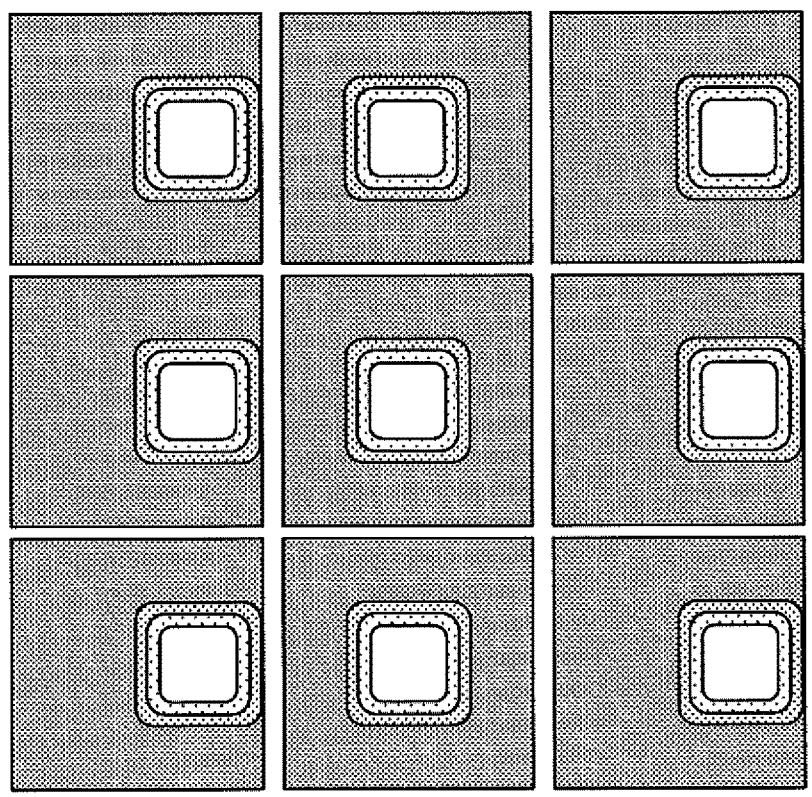
FIG. 9B illustrates the corresponding result of current detection.

If the blanking aperture array plate 20 is tilted as illustrated in FIG. 9A, the resulting current maps are as illustrated in FIG. 9B. That is, when beams in the center of the array of the multiple beams MB in the X direction are on, the highest contour lines are located in the center. However, when beams on one side of the array of the multiple beams MB in the X direction are on, the highest contour lines are shifted in the X direction. From the amount of shift of the highest contour lines, the angle of tilt of the blanking aperture array plate 20 is determined. The moving unit 40 can thus compensate for the tilt of the blanking aperture array plate 20.

Figure 10:
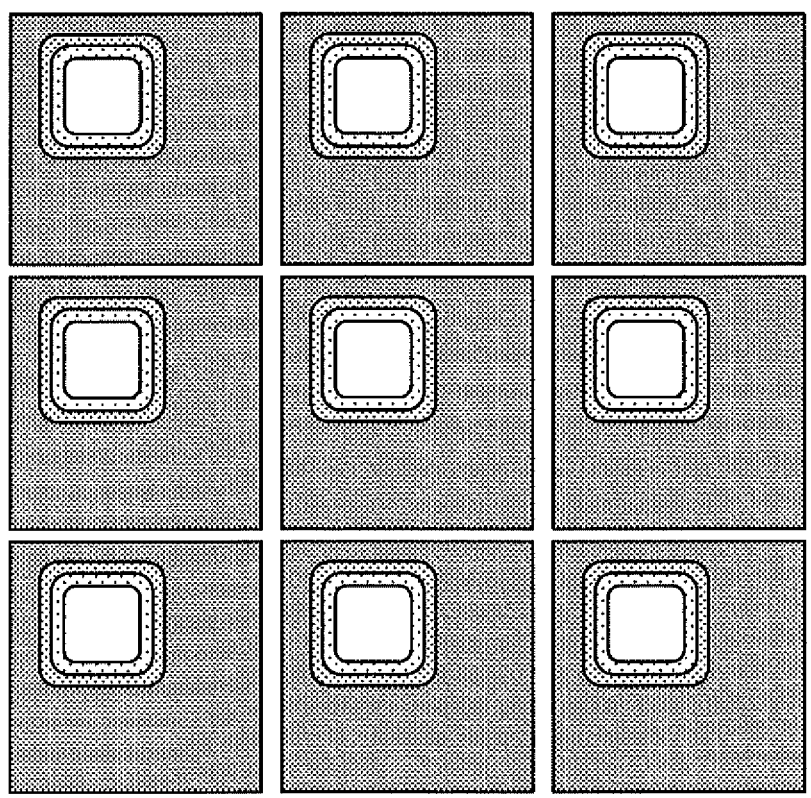
FIG. 10 illustrates a result of current detection.

FIG. 10 illustrates current maps in which the highest contour lines uniformly deviate from the corresponding map centers in the same direction. In this case, the moving unit 40 moves the blanking aperture array plate 20 in the X direction and/or Y direction on the basis of the amount of deviation from the map centers.

Figure 11:
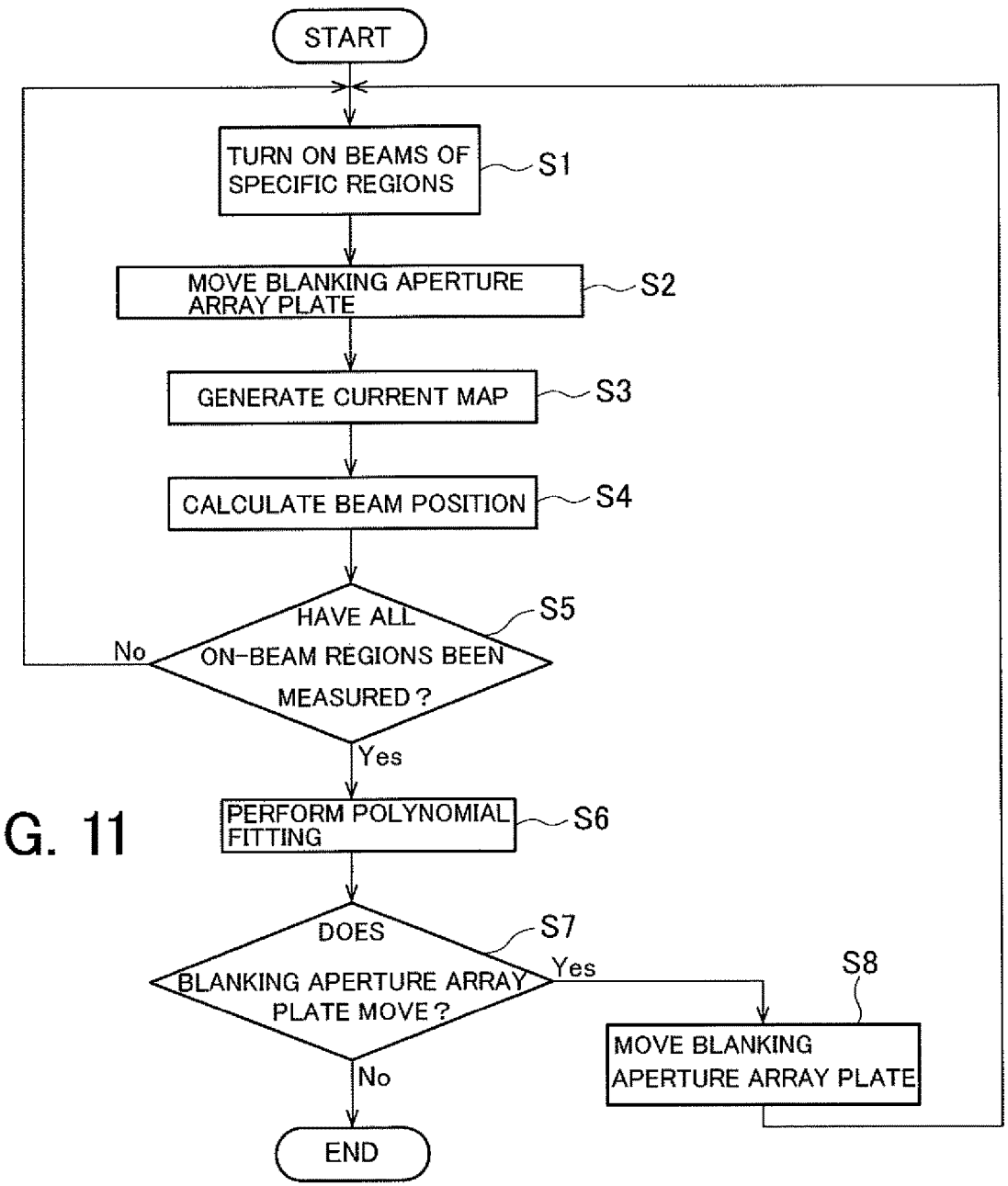
FIG. 11 is a flowchart explaining an alignment method according to an embodiment.

FIG. 11 is a flowchart that explains how the blanking aperture array plate 20 is aligned.

First, only specific regions of the multiple beams MB are turned on (step S1). The movement control circuit 66 controls the moving unit 40 to move the blanking aperture array plate 20 in the X direction and the Y direction (step S2). This causes each beam to move in such a manner as to scan the corresponding opening 20A in the XY direction. Each time the blanking aperture array plate 20 is moved by a very small distance, the detector F detects beam current.

The control computer 62 generates a current map on the basis of the result of the detection made by the detector F and the amount of travel of the blanking aperture array plate 20 (step S3). From the current map, the control computer 62 calculates an intensity gravity center representing the beam position (step S4).

The on-beam region is switched to another and the operations in steps S2 to S4 are repeated. After completion of the operations for all the on-beam regions (YES in step S5), the control computer 62 performs polynomial fitting on the beam positions for the on-beam regions to calculate the magnification of the beam position with respect to the ideal position of the blanking aperture array plate 20 (step S6). For example, if current maps such as those illustrated in FIG. 7B are obtained, the calculated magnification is smaller than the reference value, whereas if current maps such as those illustrated in FIG. 8B are obtained, the calculated magnification is greater than the reference value.

If the magnification calculated in step S6 is outside a predetermined range, then it is determined that the blanking aperture array plate 20 needs to be moved (YES in step S7), and the blanking aperture array plate 20 is moved in the Z direction on the basis of the calculated magnification (step S8).

The amount of travel of the blanking aperture array plate 20 in the Z direction is determined using an adjustment factor acquired in advance. For example, the amount of change in magnification $\Delta M$ that occurs when the blanking aperture array plate 20 is actually moved by $\Delta Z$ is measured, and the adjustment factor $\Delta Z/\Delta M$ is acquired in advance. The amount of travel of the blanking aperture array plate 20 in step S8 is determined by multiplying $\Delta Z/\Delta M$ by "magnification to be compensated for".

The adjustment factor $\Delta Z/\Delta M$ may be determined by calculation from the convergence angle of the illuminating lens 16.

The tilt of the blanking aperture array plate 20, as described above, or displacement of the blanking aperture array plate 20 in the XY direction, is detected, and the blanking aperture array plate 20 is moved to compensate for the detected tilt or displacement in the XY direction. After the blanking aperture array plate 20 is moved, the operations in steps S1 to S7 are performed again.

As described above, in the present embodiment, the blanking aperture array plate 20 is scanned while the on-beam region is being switched from one to another, and the resulting current maps are used to detect deviation of the position or orientation of the blanking aperture array plate 20. Then, the moving unit 40 capable of generating a six-degree-of-freedom motion moves the blanking aperture array plate 20 to compensate for the detected deviation of the position or orientation. This allows the multiple beams MB (all beams of the multiple beams) formed by the shaping aperture array plate 18 to pass through the openings 20A, and thus a beam array of a favorable shape is formed into an image on the substrate 36.

Figure 12:
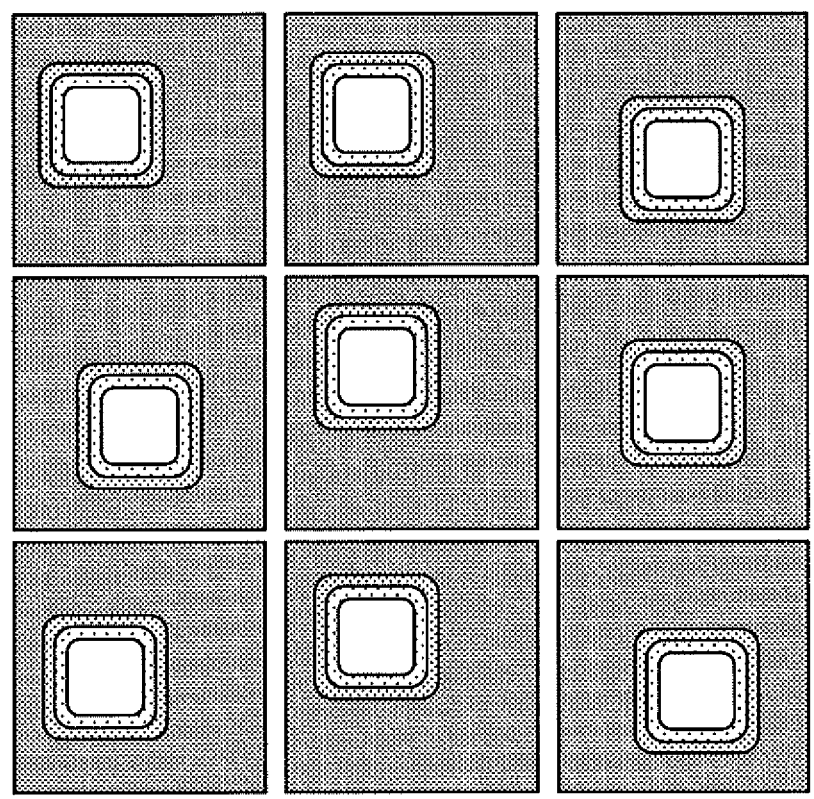
FIG. 12 illustrates a result of current detection.

In the embodiment described above, positional errors of the openings 18A in the shaping aperture array plate 18 or aberrations of the illuminating lens 16 and the objective lens 26 may cause random distribution of intensity gravity centers of current maps, as illustrated in FIG. 12. In this case, the amount of deviation of the intensity gravity center of each current map from the center of the current map is calculated, and the blanking aperture array plate 20 is moved by the average amount of deviation.

After the blanking aperture array plate 20 is moved, there may still be a current map where the intensity gravity center significantly deviates from the map center. Product settings may be configured such that beams in a region corresponding to such a current map are not used for actual writing.

In the embodiment described above, only beams in predetermined regions are turned on and a Faraday cup is used as the detector F to detect the beam current of the on-beams. Alternatively, the detector F may be one that includes an inspection aperture configured to allow passage of at least one of multiple beams and a current detector configured to detect beam current of the beam passed through the inspection aperture. The result of detection made by the current detector is sent to the control computer 62.

Figure 13:
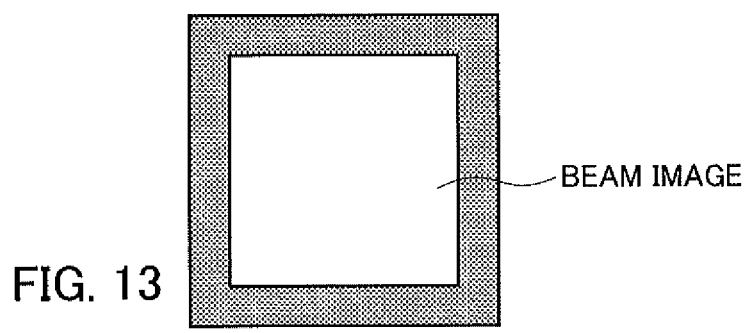
FIG. 13 illustrates a beam image.

In this case, all beams are turned on. The deflector 22 is used to cause multiple beams to scan over the inspection aperture in the XY direction, and the beam current of the beam passed through the inspection aperture is detected. The control computer 62 converts the beam current detected by the current detector into intensity, and generates a beam image on the basis of the amount of deflection made by the deflector 22. When all beams of the multiple beams MB formed by the shaping aperture array plate 18 pass through the openings 20A, a beam image, such as that illustrated in FIG. 13, is generated.

The blanking aperture array plate 20 is moved in the XY direction using the moving unit 40. Each time the blanking aperture array plate 20 is moved by a predetermined distance, the inspection aperture is scanned by multiple beams, beam current is detected, and a beam image is generated.

Figure 14:
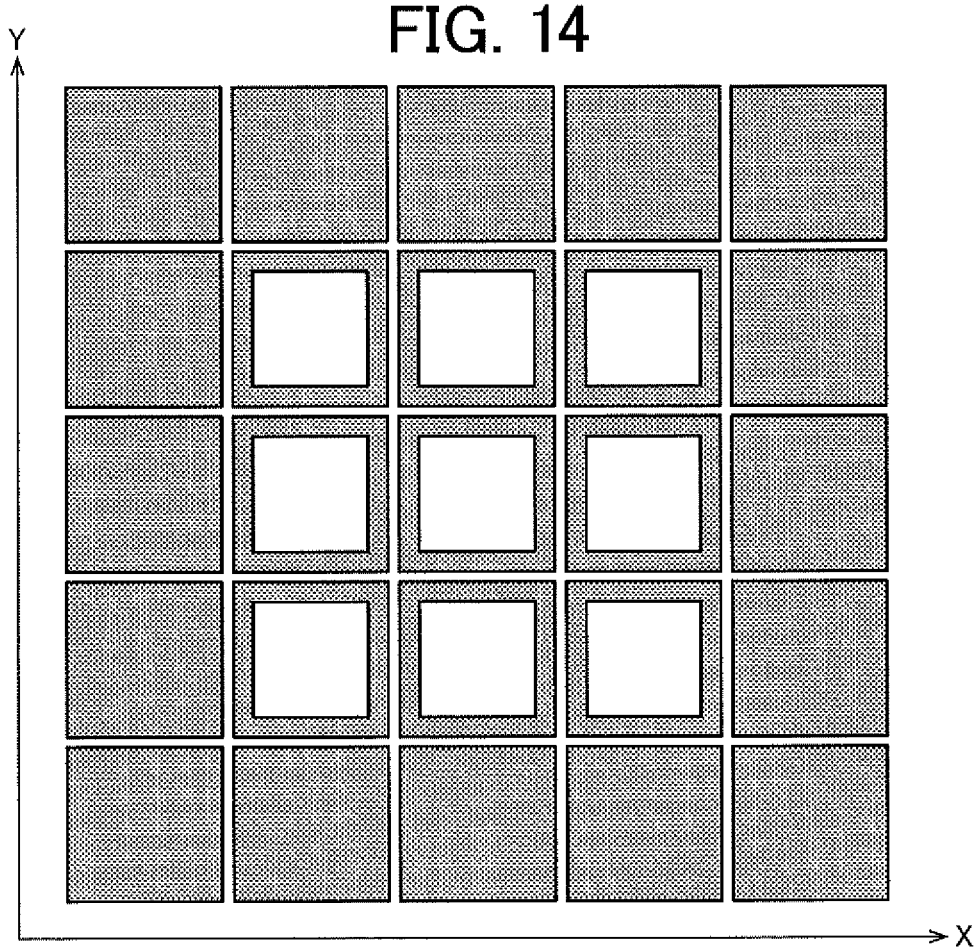
FIG. 14 illustrates beam images obtained when the blanking aperture array plate is ideally aligned.

When the blanking aperture array plate 20 is in an ideal state, the corresponding beam images arranged along the X and Y directions of the blanking aperture array plate 20 are as illustrated in FIG. 14.

Figure 15A:
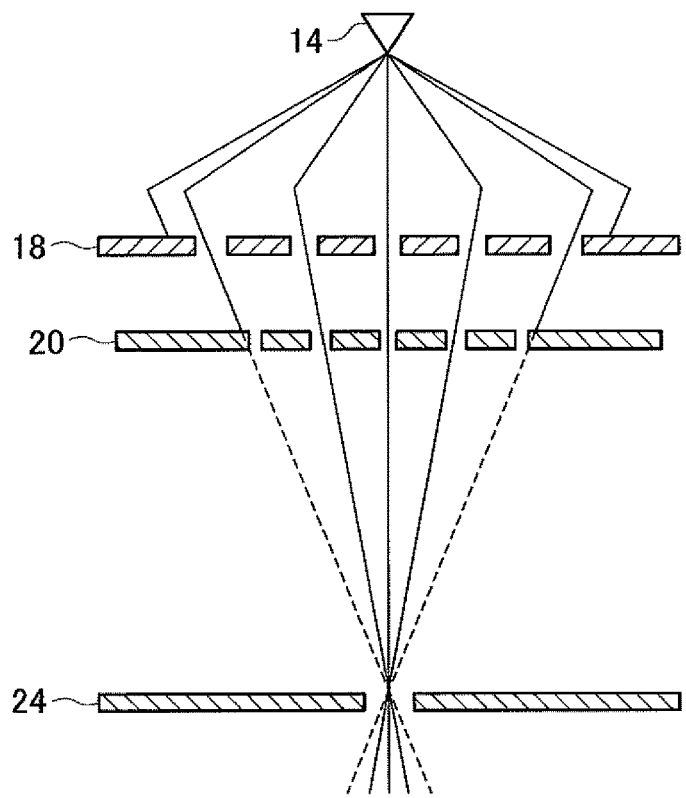
FIG. 15A is a schematic diagram of the writing apparatus.
Figure 15B:
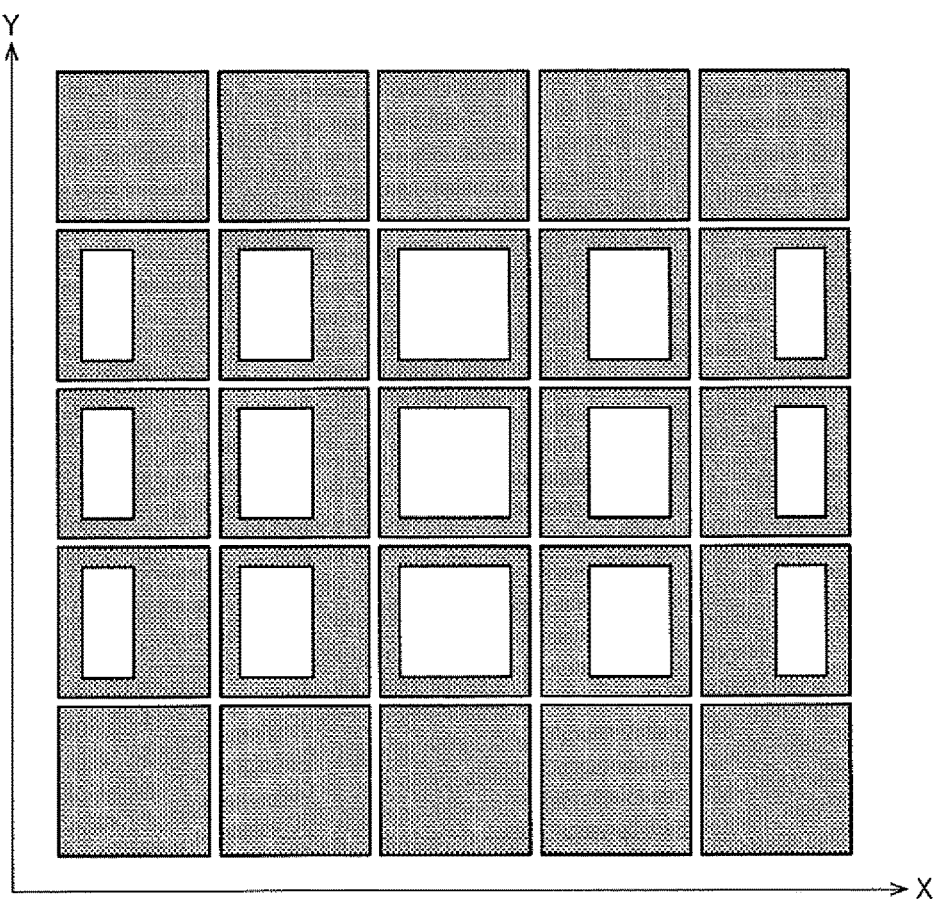
FIG. 15B illustrates beam images.

In FIG. 15A, the beam pitch of the multiple beams MB in the X direction, formed by the shaping aperture array plate 18, is greater than the pitch of openings in the blanking aperture array plate 20. In this case, the resulting beam images are such as those illustrated in FIG. 15B. On the basis of the characteristics of the beam images, the control computer 62 controls, for example, the position or orientation of the blanking aperture array plate 20 and lens aberrations.

Although the moving unit 40 adjusts the position or orientation of the blanking aperture array plate 20 in the embodiments described above, the moving unit 40 may adjust the position or orientation of the shaping aperture array plate 18.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An aperture array alignment method comprising:
   emitting a charged particle beam;
   forming multiple beams by allowing the charged particle beam to pass through a plurality of openings in a shaping aperture array plate;
   performing blanking deflection using a plurality of blankers in a blanking aperture array plate, the blanking deflection being performed by each of the blankers to switch on and off of a corresponding one of the multiple beams; and
   detecting beam current on a stage using a detector disposed on the stage, the stage being capable of holding a substrate thereon,
   wherein at least one of the multiple beams is turned on to scan the blanking aperture array plate, and a current map is generated based on a result of detection of the beam current made by the detector and a position of the blanking aperture array plate;
   an on-beam is switched from one to another to generate the current map for each of the on-beams; and
   the position of the blanking aperture array plate is adjusted based on the current maps for the on-beams.

2. The method according to claim 1, wherein a magnification of a beam position is calculated from the current maps for the on-beams, and the blanking aperture array plate is moved in a Z direction based on the magnification.

3. The method according to claim 1, wherein when highest contour lines in the current maps for the on-beams deviate from corresponding map centers in a same direction, the blanking aperture array plate is moved in an X direction and/or a Y direction based on an amount of deviation from the map centers.

4. The method according to claim 1, wherein a tilt of the blanking aperture array plate is adjusted based on respective positions of highest contour lines in the current maps for the on-beams.

5. The method according to claim 1, wherein the blanking aperture array plate is moved based on an average of amounts of deviation of intensity gravity centers in the current maps for the on-beams from respective centers of the current maps.

6. The method according to claim 1, wherein the multiple beams form a square array, and a center portion, four corners, and respective center portions of edges along four sides of the square array are each an on-beam region.

7. A multi charged particle beam writing apparatus comprising:
   a stage capable of holding a substrate thereon;
   an emitter emitting a charged particle beam;

a shaping aperture array plate including a plurality of openings formed therein, irradiated with the charged particle beam in a region including the plurality of openings, and forming multiple beams by allowing part of the charged particle beam to pass through the plurality of openings;

a blanking aperture array plate including a plurality of blankers, each of the blankers performing blanking deflection for switching on and off of a corresponding one of the multiple beams;

a detector disposed on the stage and detecting beam current on the stage;

an aperture array mover moving the blanking aperture array plate; and a controller controlling the plurality of blankers and the aperture array mover and acquiring a result of detection of the beam current from the detector, wherein the controller turns on at least one of the multiple beams to scan the blanking aperture array plate, generates a current map based on the result of detection of the beam current made by the detector and a position of the blanking aperture array plate, switches an on-beam from one to another to generate the current map for each of the on-beams, controls the aperture array mover based on the current maps for the on-beams, and adjusts the position of the blanking aperture array plate.

8. The apparatus according to claim 7, wherein the controller calculates a magnification of a beam position from the current maps for the on-beams, and moves the blanking aperture array plate in a Z direction based on the magnification.

9. The apparatus according to claim 7, wherein when highest contour lines in the current maps for the on-beams deviate from corresponding map centers in a same direction, the controller moves the blanking aperture array plate in an X direction and/or a Y direction based on an amount of deviation from the map centers.

10. The apparatus according to claim 7, wherein the controller adjusts a tilt of the blanking aperture array plate based on respective positions of highest contour lines in the current maps for the on-beams.

11. The apparatus according to claim 7, wherein the controller moves the blanking aperture array plate based on an average of amounts of deviation of intensity gravity centers in the current maps for the on-beams from respective centers of the current maps.

12. The apparatus according to claim 7, wherein the multiple beams form a square array, and a center portion, four corners, and respective center portions of edges along four sides of the square array are each an on-beam region.

13. The apparatus according to claim 7, wherein the aperture array mover is capable of moving the blanking aperture array plate in six degrees of freedom.

* * * * *